US010608583B2

(12) United States Patent
Taghivand et al.

(10) Patent No.: US 10,608,583 B2
(45) Date of Patent: Mar. 31, 2020

(54) PHASE NOISE REDUCTION TECHNIQUES FOR VOLTAGE-CONTROLLED OSCILLATORS (VCOS)

(71) Applicant: QUALCOMM Incorporated, San Diego, CA (US)

(72) Inventors: Mazhareddin Taghivand, Santa Clara, CA (US); Alireza Khalili, Sunnyvale, CA (US); Mohammad Emadi, San Jose, CA (US); Yashar Rajavi, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 15/638,183

(22) Filed: Jun. 29, 2017

(65) Prior Publication Data

US 2018/0076765 A1    Mar. 15, 2018

Related U.S. Application Data

(60) Provisional application No. 62/394,339, filed on Sep. 14, 2016.

(51) Int. Cl.
*H03B 1/04* (2006.01)
*H03B 5/12* (2006.01)
*H03B 27/00* (2006.01)

(52) U.S. Cl.
CPC ............... *H03B 1/04* (2013.01); *H03B 5/124* (2013.01); *H03B 5/1212* (2013.01); *H03B 5/1228* (2013.01); *H03B 27/00* (2013.01); *H03B 2200/007* (2013.01); *H03B 2200/009* (2013.01); *H03B 2200/0054* (2013.01)

(58) Field of Classification Search
CPC .......... H03B 1/04; H03B 27/00; H03B 5/124; H03B 5/1212; H03B 5/1228; H03B 2200/007; H03B 2200/0054; H03B 2200/009
See application file for complete search history.

(56) References Cited

U.S. PATENT DOCUMENTS

| 7,463,106 | B2 | 12/2008 | Shin et al. |
| 8,044,741 | B2 | 10/2011 | Barton et al. |
| 8,159,308 | B1 | 4/2012 | Sutardja |
| 8,742,862 | B1 | 6/2014 | Taghivand |
| 9,257,939 | B1 * | 2/2016 | Zhang ................ H03B 5/1212 |
| 9,490,745 | B1 | 11/2016 | Toso et al. |
| 9,559,702 | B1 * | 1/2017 | Manetakis ............. H03L 7/00 |

(Continued)

OTHER PUBLICATIONS

International Search Report and Written Opinion—PCT/US2017/047163—ISA/EPO—dated Nov. 7, 2017.

*Primary Examiner* — Jeffrey M Shin
(74) *Attorney, Agent, or Firm* — Patterson & Sheridan, L.L.P. Qualcomm

(57) ABSTRACT

Certain aspects of the present disclosure provide methods and apparatus for reducing phase noise in voltage-controlled oscillators (VCOs). One example VCO generally includes a first resonant circuit comprising an inductor and a first variable capacitive element coupled in parallel with the inductor; and a second variable capacitive element coupled to a center tap of the inductor and further coupled to a reference voltage, wherein the center tap of the inductor is further coupled to a voltage source.

22 Claims, 10 Drawing Sheets

(56) References Cited

U.S. PATENT DOCUMENTS

| | | | |
|---|---|---|---|
| 2014/0132359 A1* | 5/2014 | Taghivand | H03B 5/1228 331/16 |
| 2015/0200627 A1* | 7/2015 | Valdes-Garcia | G06F 17/5063 331/8 |
| 2016/0226441 A1 | 8/2016 | Valdes-Garcia et al. | |
| 2017/0005617 A1 | 1/2017 | Trotta | |

* cited by examiner

PHASE NOISE REDUCTION TECHNIQUES FOR VOLTAGE-CONTROLLED OSCILLATORS (VCOS)

CROSS-REFERENCE TO RELATED APPLICATIONS

This application claims the benefit of U.S. Provisional Patent No. 62/394,339, filed Sep. 14, 2016. The content of the provisional application is hereby incorporated by reference in its entirety.

TECHNICAL FIELD

Certain aspects of the present disclosure generally relate to electronic circuits and, more particularly, to voltage-controlled oscillator (VCO) circuits incorporating techniques for phase noise reduction.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit or receive data and/or control information, the radio frequency front end of the base station and/or the mobile station may include one or more frequency synthesizers to generate oscillating signals used for upconverting baseband signals and downconverting radio frequency (RF) signals. At least one of the frequency synthesizers may include a voltage-controlled oscillator (VCO) for tuning an oscillating signal to different frequencies. In modern communication systems, it is typically desirable to use VCOs with low phase noise and low power consumption.

SUMMARY

Certain aspects of the present disclosure generally relate to techniques and apparatus for reducing phase noise (e.g., due to flicker noise) in voltage-controlled oscillators (VCOs) and digitally controlled oscillators (DCOs), which refer to the combination of a VCO driven by a control signal from a digital-to-analog converter (DAC). For ease of description, the remainder of the disclosure refers only to VCOs, but a person having ordinary skill in the art will understand that aspects of the disclosure apply to both VCOs and DCOs.

Certain aspects of the present disclosure provide a VCO. The VCO generally includes a first resonant circuit comprising an inductor and a first variable capacitive element coupled in parallel with the inductor; and a second variable capacitive element coupled to a center tap of the inductor and further coupled to a reference voltage, wherein the center tap of the inductor is further coupled to a voltage source.

Certain aspects of the present disclosure provide a method for reducing noise in an oscillating signal. The method generally includes generating the oscillating signal with a first resonant circuit of a voltage-controlled oscillator (VCO). The method further includes generating a common mode resonant high impedance at two times an oscillating frequency of the oscillating signal at oscillating terminals of the first resonant circuit.

Certain aspects of the present disclosure provide an apparatus for reducing noise in an oscillating signal. The apparatus generally includes means for generating the oscillating signal with a first resonant circuit of a voltage-controlled oscillator (VCO). The apparatus further includes means for generating a common mode resonant high impedance at two times an oscillating frequency of the oscillating signal at oscillating terminals of the first resonant circuit.

Certain aspects of the present disclosure provide a computer readable medium having instructions stored thereon for causing a circuit to perform a method of for reducing noise in an oscillating signal. The method includes controlling generation of the oscillating signal by a first resonant circuit of a voltage-controlled oscillator (VCO). The method further includes controlling generation of a common mode resonant high impedance at two times an oscillating frequency of the oscillating signal at oscillating terminals of the first resonant circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
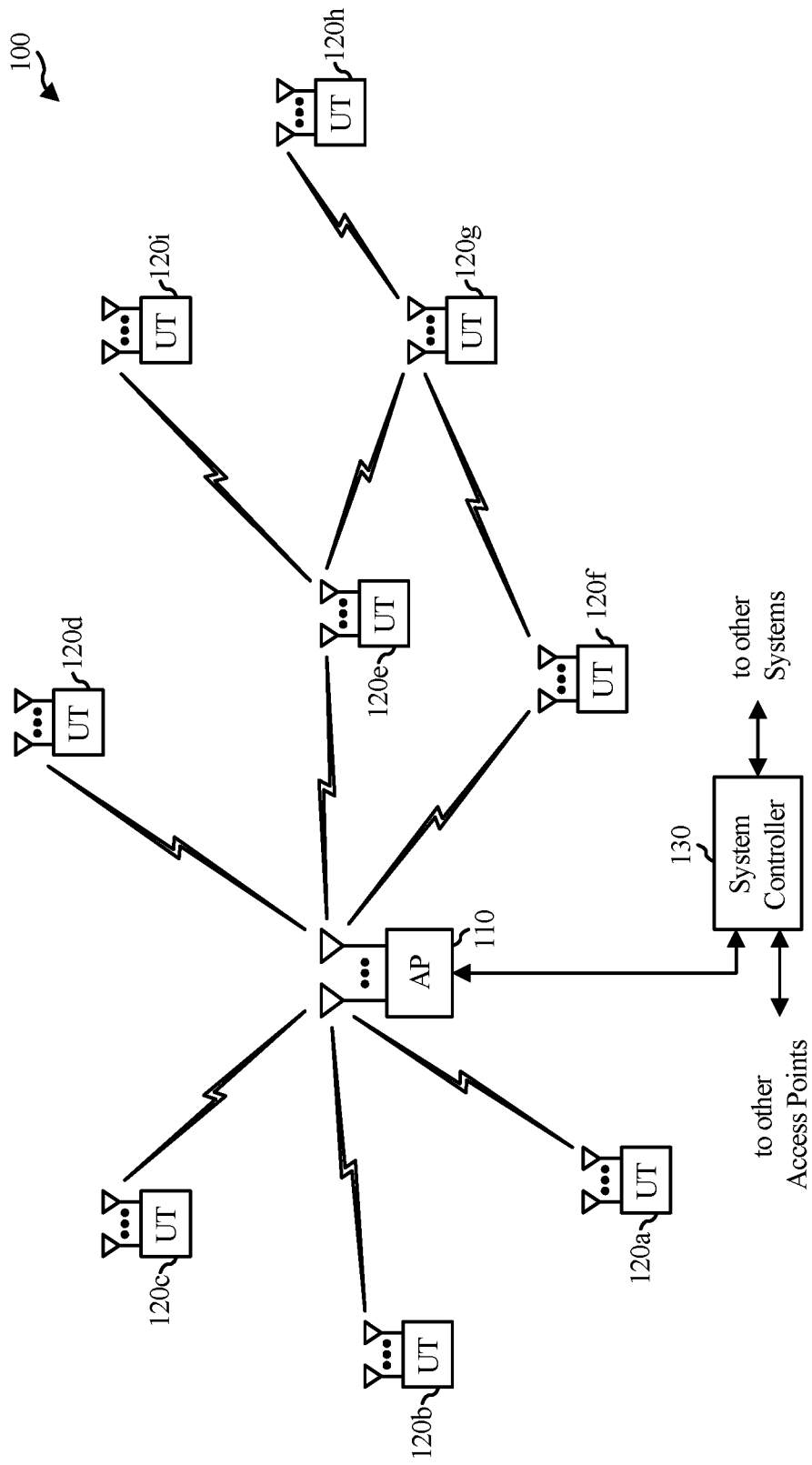
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers to generate periodic signals used for signal transmission and/or reception. At least one of the frequency synthesizers may include a VCO implementing the techniques for reducing phase noise (e.g., due to flicker noise), in accordance with certain aspects of the present disclosure.

Figure 2:
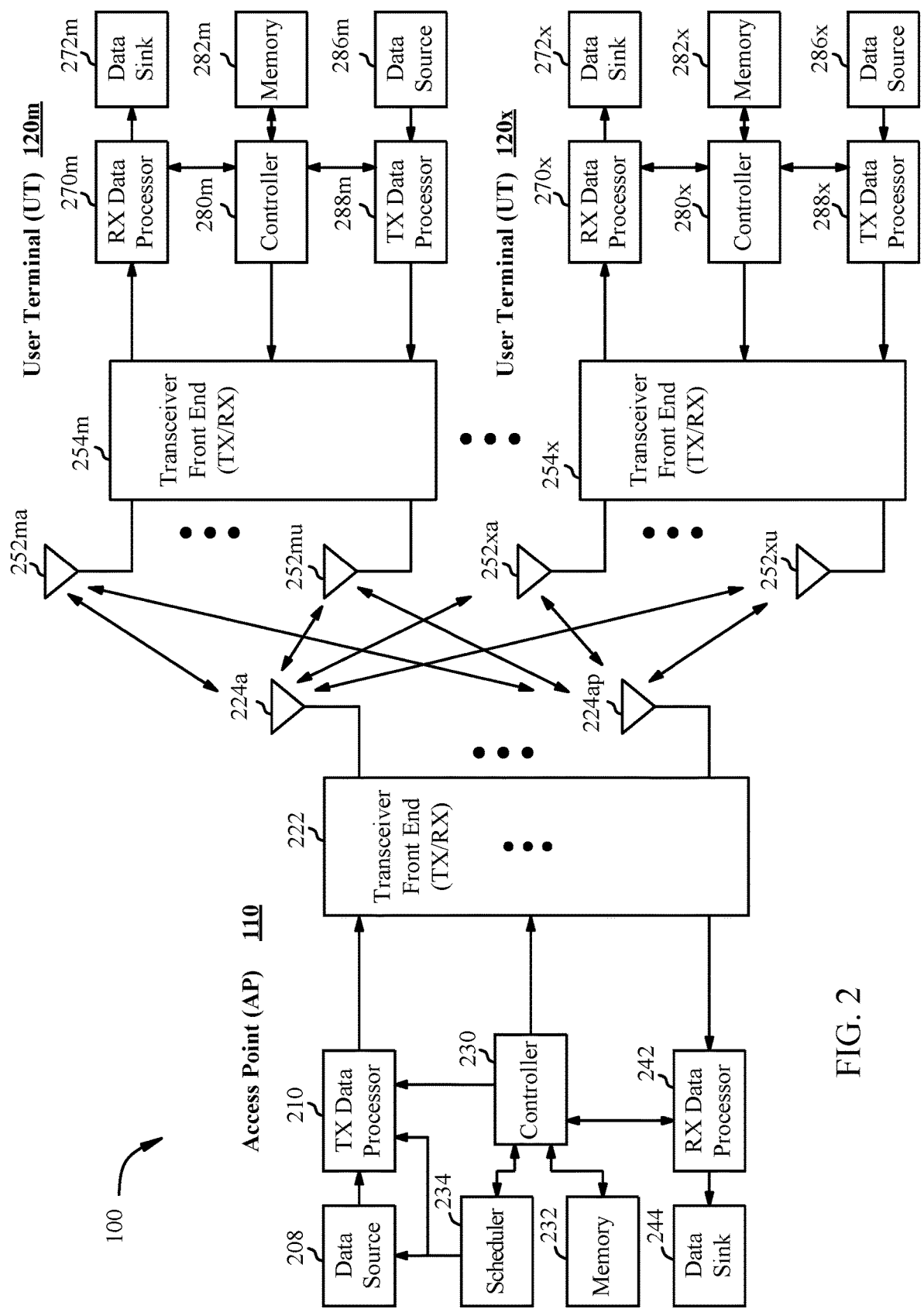
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more frequency synthesizers to generate oscillating signals used for signal transmission and/or reception. At least one of the frequency synthesizers may include a VCO implementing the techniques for reducing phase noise (e.g., due to flicker noise), in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
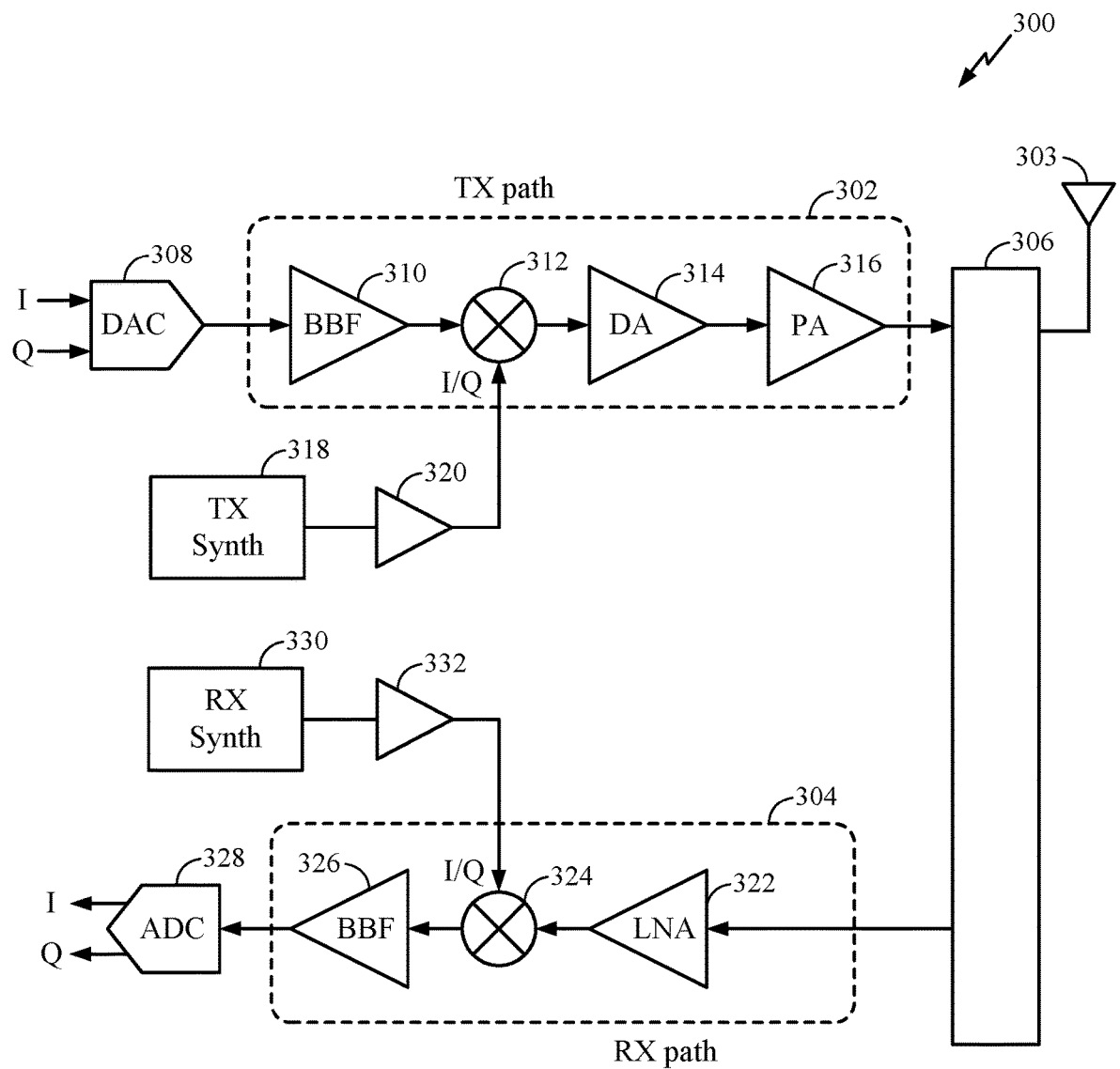
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

The TX frequency synthesizer 318 and/or RX frequency synthesizer 330 may comprise a VCO implementing the techniques for reducing phase noise (e.g., due to flicker noise), in accordance with certain aspects of the present disclosure.

Example Voltage-Controlled Oscillators

Modern communication systems may rely on low phase noise to obtain high signal-to-noise ratio (SNR) in both receive and transmit paths (e.g., RX and TX paths 304, 302). Phase noise is the frequency domain representation of random fluctuations in the phase of a waveform, such as the oscillating signal produced by a VCO. Whereas an ideal oscillator would generate a pure sine wave, real oscillators have phase-modulated noise components that spread the power of the oscillating signal to adjacent frequencies, resulting in noise sidebands. Oscillator phase noise may include low frequency flicker noise and white noise. Flicker noise is a type of electronic noise having a 1/f power density spectrum, and although flicker noise appears as a low-frequency phenomenon, this low-frequency noise can be upconverted to frequencies close to the carrier frequency, which results in oscillator phase noise. As complementary metal-oxide-semiconductor (CMOS) processes scale, the flicker noise increases, which may prevent designing for the minimum channel length in the VCO.

Accordingly, what is needed are techniques and apparatus for reducing the phase noise by reducing flicker noise in VCOs.

Certain aspects of the present disclosure relate to creating a common mode resonant high impedance at two times an oscillating frequency (e.g., resonant frequency) of a VCO at oscillating terminals (e.g., output terminals) of a resonant circuit of the VCO. Accordingly, in some aspects, the flicker corner frequency of the VCO is moved from a range in the hundreds of kHz to a range in the tens of kHz. Therefore, the flicker noise of the VCO may be reduced as compared to VCOs without a common mode resonant high impedance at two times an oscillating frequency of a VCO at oscillating terminals of a resonant circuit of the VCO.

In certain aspects, the common mode resonant high impedance at the oscillating terminals of a resonant circuit of the VCO is created by introducing a variable capacitive element (e.g., a capacitor bank, a variable capacitor, etc.) coupled between a reference voltage (e.g., electrical ground) and a node (e.g., voltage supply node (e.g., a node where the VCO couples with a voltage supply source)) between a center tap of an inductor of the VCO and the voltage supply source to the VCO. The variable capacitive element may be tuned to create a common mode resonant high impedance at two times an oscillating frequency of a VCO at oscillating terminals of a resonant circuit of the VCO. For example, the variable capacitive element may be tuned based on an equivalent inductance of a resonant circuit (e.g., comprising a capacitive element in parallel with an inductor) of the VCO as discussed herein.

Figure 4:
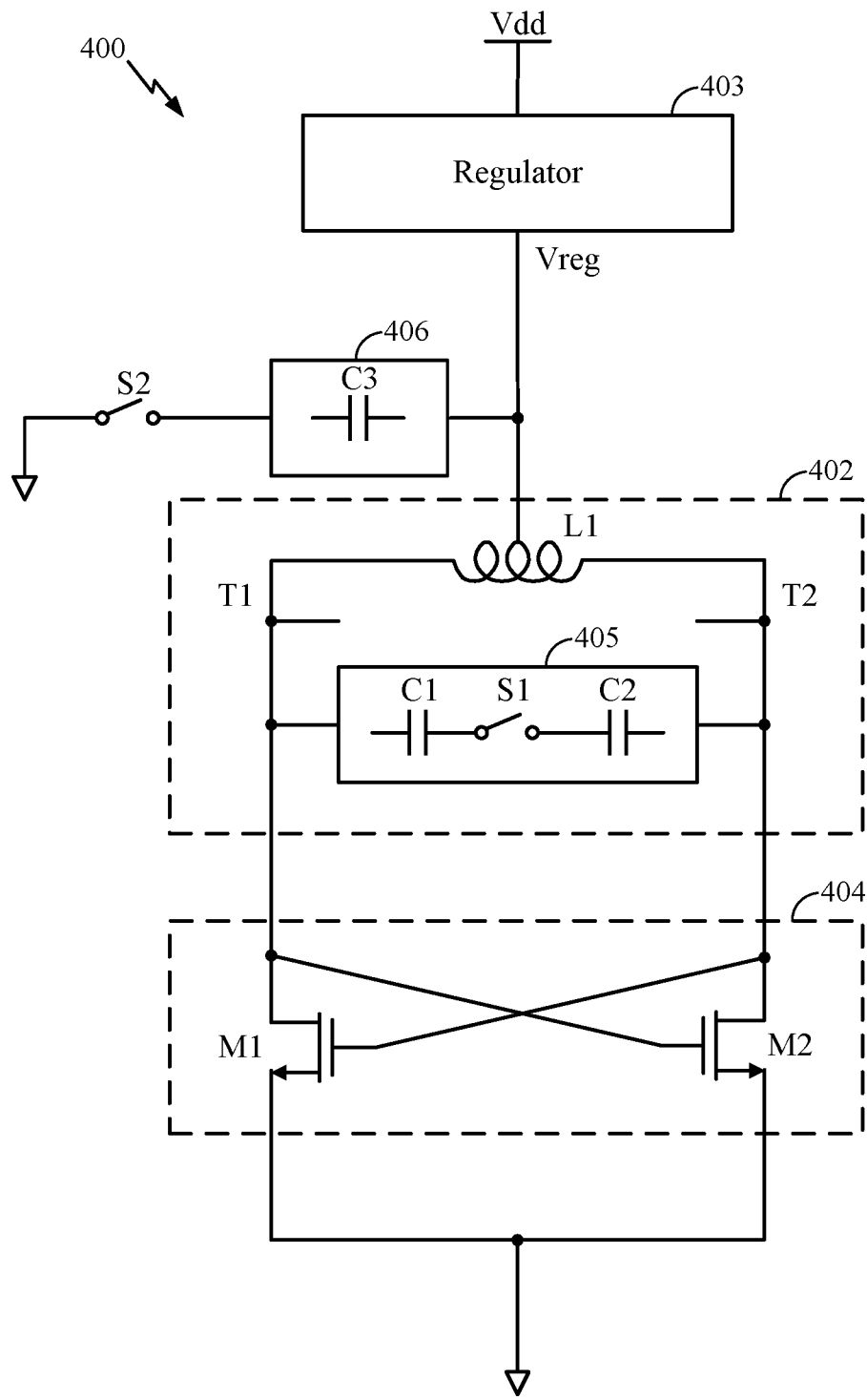
FIG. 4 is a schematic diagram of an example VCO with reduced phase noise, in accordance with certain aspects of the present disclosure.

FIG. 4 is a schematic diagram of an example VCO 400, in accordance with certain aspects of the present disclosure. As illustrated, the VCO 400 has a resonant circuit 402 (also referred to as an inductor-capacitor (LC) circuit, a tank circuit, or a tuned circuit) and an active negative transconductance ($-g_m$) circuit 404 connected with the resonant circuit 402. Certain aspects may include a bias current circuit (not shown here) for sourcing (or sinking) a bias current through the resonant circuit 402 and the active negative transconductance circuit 404 to generate an oscillating signal. As illustrated in FIG. 4, a pair of NMOS transistors M1 and M2 are cross-coupled to form the active negative transconductance circuit 404 that serves to cancel out the loss (due to parasitics) of the resonant circuit 402 and, thus, to sustain the oscillation mechanism. The resonant circuit 402 may include a center-tapped inductor L1 (or two series inductors) and a variable capacitive element 405 (e.g., shown as a capacitor bank comprising capacitors C1 and C2) designed to oscillate at a certain resonant frequency. In certain aspects, the variable capacitive element 405 may comprise a variable capacitor and/or a capacitor bank (e.g., with a plurality of capacitors switchably connected in parallel and/or series).

The inductor L1 and/or one or more capacitors in the variable capacitive element 405 may be variable to adjust the VCO frequency within a tuning range. For certain aspects, the resonant circuit 402 may include one or more switches (e.g., represented by switch S1 in FIG. 4) used to select different combinations of capacitors in the variable capacitive element 405, thereby adjusting the resonance of the circuit. A regulator 403 or another circuit may provide an output voltage (Vreg) (e.g., regulated from a supply rail) for tuning the inductor L1 and controlling the VCO frequency. For example, as shown, an output terminal of the regulator 403 is coupled to a center tap of the inductor L1. The VCO 400 may receive power from a power supply voltage (e.g., Vdd) referenced to another voltage (e.g., electrical ground).

As described above, the VCO 400 may include a variable capacitive element 406 (e.g., shown as a capacitor C3). In certain aspects, the variable capacitive element 406 may comprise a variable capacitor and/or a capacitor bank (e.g., with a plurality of capacitors switchably connected in parallel and/or series). The variable capacitive element 406 as shown may be coupled at one end to the center tap of the inductor L1 and coupled (e.g., switchably coupled by switch S2 as shown) to a reference voltage (e.g., electrical ground) at the other end.

In certain aspects, the variable capacitive element 406 may be tuned to create a common mode resonant high impedance at two times an oscillating frequency of the resonant circuit 402 at oscillating terminals (e.g., T1 and T2) of the resonant circuit 402. Such a common mode resonant high impedance may push a flicker corner frequency of the VCO 400 from a range of hundreds of kHz to tens of kHz, thereby reducing the flicker noise of the VCO 400. The oscillating frequency of the resonant circuit 402 may be based on the capacitance of the variable capacitance element 405 and the inductance of the inductor L1. A change in the capacitance of the variable capacitance element 405, by tuning the variable capacitance element 405, may therefore change the oscillating frequency of the resonant circuit 402. Thus, the variable capacitive element 406 may be tuned based on the tuning of the variable capacitance element 405 to ensure a common mode resonant high impedance at two times an oscillating frequency of the resonant circuit 402 at oscillating terminals of the resonant circuit 402.

In certain aspects, the variable capacitive element 406 may be tuned based on the equivalent inductance ($L_{eq}$) of the resonant circuit 402 to ensure a common mode resonant high impedance at two times an oscillating frequency of the resonant circuit 402 at oscillating terminals of the resonant circuit 402, as discussed herein. In particular, the variable capacitive element 406 may be tuned so a common mode impedance ($Z_{cm}$) of the resonant circuit 402 (e.g., common mode resonant high impedance) may resonate at two times an oscillating frequency of the resonant circuit 402. The common mode impedance may be the impedance of the resonant circuit 402 as measured when shorting the output terminals (e.g., T1 and T2) of the resonant circuit 402 (e.g., connecting terminals T1 and T2 as shown in FIG. 4), as discussed herein. In certain aspects, the impedance of the variable capacitive element 406 may be set so that the common mode impedance/frequency peaks at two times the resonant frequency of the resonant circuit 402.

Figure 4A:
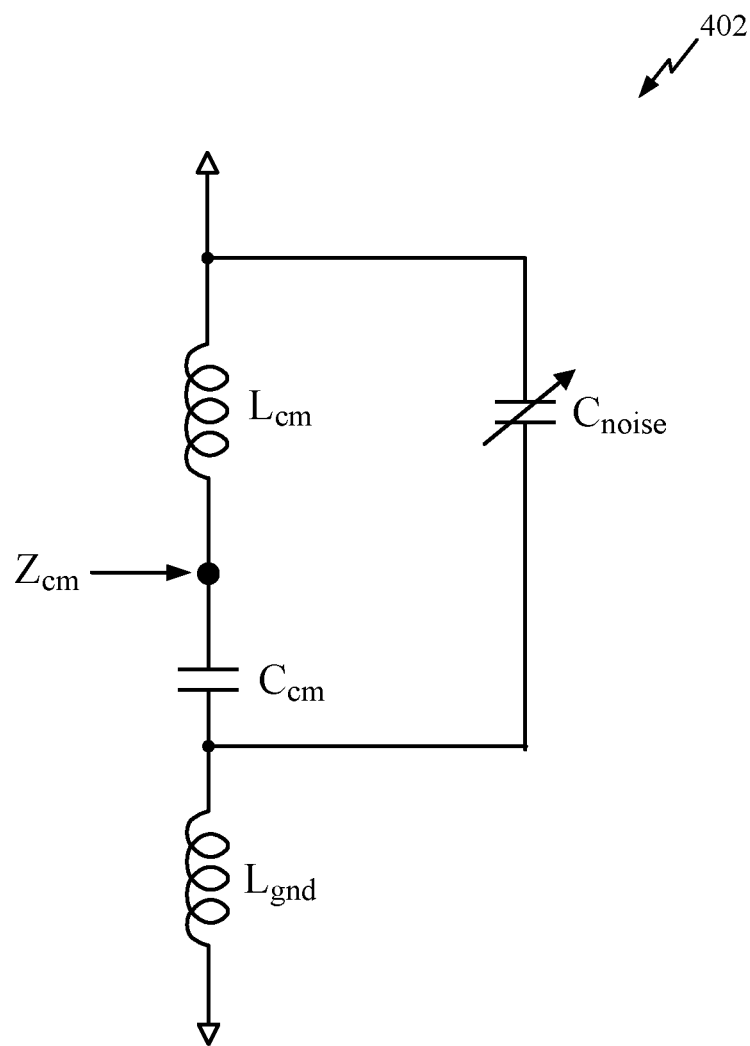
FIG. 4A is a schematic diagram of an equivalent circuit to the resonant circuit of FIG. 4 when shorting the output terminals of the resonant circuit, in accordance with certain aspects of the present disclosure.

FIG. 4A is a schematic diagram of an equivalent circuit to the resonant circuit 402 of FIG. 4 when shorting the output terminals of the resonant circuit 402, in accordance with certain aspects of the present disclosure. As shown, the resonant circuit 402 has a common mode inductance ($L_{cm}$), which may be based on the inductance of inductor L1. In certain aspects, $L_{cm}$ may be measured between the shorted output terminals and the center tap of the inductor L1. Further, the resonant circuit 402 has a common mode capacitance ($C_{cm}$), which may be based on the capacitance of the variable capacitive element 405. In certain aspects, $C_{cm}$ may be measured between the shorted output terminals and the center tap of the inductor L1. Further, the resonant circuit 402 may be subject to capacitance between the center tap of the inductor L1 and a reference voltage (e.g., electrical ground) from the variable capacitive element 406. Such capacitance is shown in FIG. 4A as $C_{noise}$. In addition, the resonant circuit 402 may be subject to parasitic inductance between the resonant circuit 402 and a reference voltage (e.g., electrical ground). Such parasitic inductance is shown in FIG. 4A as $L_{gnd}$.

Further, $Z_{cm}$ of the resonant circuit 402 may be measured between the shorted output terminals and the center tap of the inductor L1. $Z_{cm}$ may be calculated according to the following equations describing the circuit shown in FIG. 4A:

$$Z_{cm} = \frac{\frac{L_{eq}}{C_{cm}}}{L_{eq}s + \frac{1}{C_{cm}s}} + L_{gnd}s = \frac{L_{eq}s}{1 - L_{eq}C_{cm}\omega^2} + L_{gnd}s \quad (1)$$

$$L_{eq}s = L_{cm}s + \frac{1}{C_{noise}s} \quad (2)$$

In order to ensure a high $Z_{cm}$, the term $1-L_{eq}C_{cm}\omega^2$ shown in equation 1 should be near zero (e.g., as close to zero as feasible). The variable $\omega$ refers to the oscillating frequency (e.g., resonant frequency) of the resonant circuit 402. Further, as shown, $L_{eq}$ is based on $C_{noise}$ which is related to the capacitance of the variable capacitive element 406. Therefore, in certain aspects, the capacitance of the variable capacitive element 406 may be tuned to bring the term $1-L_{eq}C_{cm}\omega^2$ as close to zero as possible. Accordingly, in certain aspects, the capacitance of the variable capacitive element 406 may be tuned so that $Z_{cm}$ resonates at $2*\omega$ (or substantially at $2*\omega$), as this is where the maximum $Z_{cm}$ may be attained. Further, since $\omega$ is based on the capacitance of variable capacitive element 405, the capacitance of the variable capacitive element 406 may be selected (tuned) based on the capacitance of variable capacitive element 405.

In certain aspects, the capacitance of variable capacitive element 405 and/or variable capacitive element 406 may be controlled by a controller (e.g., the controller 230 or controller 280) such that the VCO 400 operates at the desired resonant frequency based on the capacitance of the variable capacitive element 405, and flicker noise is reduced based on the capacitance of the variable capacitive element 406 being tuned to create a resonance at two times the resonant frequency of the VCO 400. For example, the controller may control the opening and closing of switches (e.g., representative switches S1 and S2) associated with the variable capacitive element 405 and/or variable capacitive element 406 to selectively couple capacitors of the variable capacitive element 405 and/or variable capacitive element 406 to the VCO 400.

Figure 5:
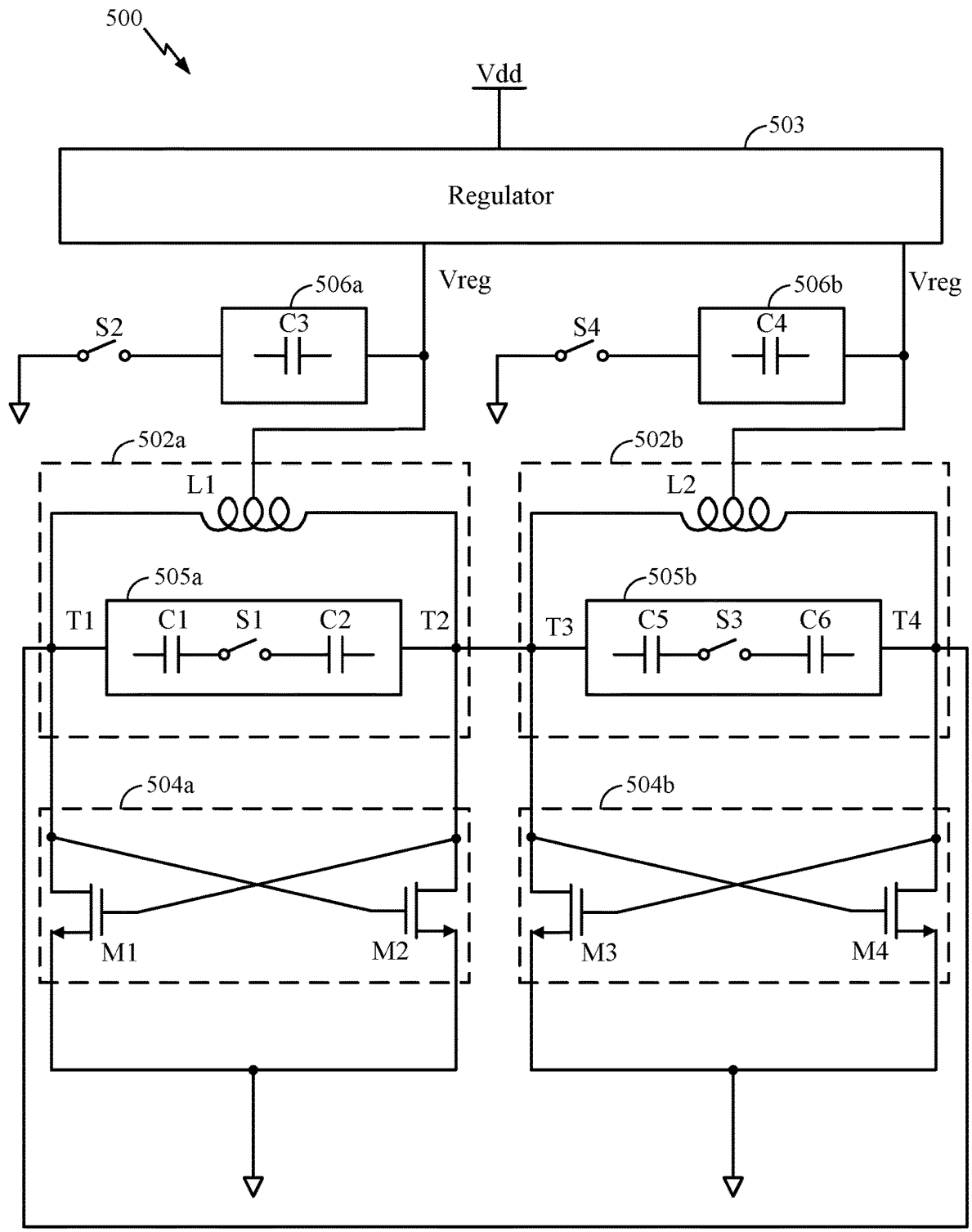
FIG. 5 is a schematic diagram of another example VCO with reduced phase noise, in accordance with certain aspects of the present disclosure.

FIG. 5 is a schematic diagram of another example VCO 500, in accordance with certain aspects of the present disclosure. As illustrated, the VCO 500 is similar to the VCO 400, but includes two resonant circuits 502a and 502b coupled to each other. In some aspects, the components of the two resonant circuits 502a and 502b may have the same properties (e.g., capacitance, impedance, inductance, etc.) and be coupled together in order to reduce a phase noise of the VCO 500 as compared to the VCO 400 (e.g., by 3 dB). In particular, the VCO 500 includes two resonant circuits 502a and 502b (also referred to as an inductor-capacitor (LC) circuit, a tank circuit, or a tuned circuit) and two active negative transconductance ($-g_m$) circuits 504a and 504b connected with the resonant circuits 502a and 502b, respectively. Certain aspects may include a bias current circuit (not shown here) for sourcing (or sinking) a bias current through the resonant circuits 502a and 502b and the active negative transconductance circuits 504a and 504b to generate an oscillating signal. As illustrated in FIG. 5, a pair of NMOS transistors M1 and M2 are cross-coupled to form the active negative transconductance circuit 504a (and similarly a pair of NMOS transistors M3 and M4 form the active negative transconductance circuit 504b) that serves to cancel out the loss (due to parasitics) of the resonant circuit 502a (and similarly resonant circuit 502b) and, thus, to sustain the oscillation mechanism. The resonant circuit 502a may include a center-tapped inductor L1 (or two series inductors) and a variable capacitive element 504a (e.g., shown as a capacitor bank comprising capacitors C1 and C2) designed to oscillate at a certain resonant frequency. In certain aspects, the variable capacitive element 504a may comprise a variable capacitor and/or a capacitor bank (e.g., with a plurality of capacitors switchably connected in parallel and/or series). Similarly, the resonant circuit 502b may include a center-tapped inductor L2 (or two series inductors) and a variable capacitive element 504b (e.g., shown as a capacitor bank comprising capacitors C5 and C6) designed to oscillate at a certain resonant frequency. In certain aspects, the resonant circuit 502b may be configured to oscillate at the same resonant frequency as the resonant circuit 502a to reduce phase noise. In certain aspects, the variable capacitive element 504b may comprise a variable capacitor and/or a capacitor bank (e.g., with a plurality of capacitors switchably connected in parallel and/or series). The resonant circuits 502a and 502b may be coupled in parallel as shown, with a terminal T1 of the resonant circuit 502a being coupled to a terminal T4 of the resonant circuit 502b, and a terminal T2 of the resonant circuit 502a being coupled to a terminal T3 of the resonant circuit 502b.

The inductor L1/L2 and/or one or more capacitors in the variable capacitive element 505a/505b may be variable to adjust the VCO 500 frequency within a tuning range. For certain aspects, the resonant circuit 502a/502b may include one or more switches (e.g., represented by switch S1/S3 in FIG. 5) used to select different combinations of capacitors in the variable capacitive element 505a/505b, thereby adjusting the resonance of the circuit. A regulator 503 or another circuit may provide an output voltage (Vreg) for tuning the inductor L1/L2 and controlling the VCO frequency. For example, as shown, an output terminal of the regulator 503 is coupled to a center tap of the inductor L1/L2. The VCO 500 may receive power from a power supply voltage (e.g., Vdd) referenced to another voltage (e.g., electrical ground).

Similar to as described above with respect to FIG. 4, the VCO 500 may include variable capacitive element 506a/506b (e.g., shown as a capacitor C3/C4). In certain aspects, the variable capacitive element 506a/506b may comprise a variable capacitor and/or a capacitor bank (e.g., with a plurality of capacitors switchably connected in parallel or series). The variable capacitive element 506a/506b as shown may be coupled at one end to the center tap of the inductor L1/L2 and coupled (e.g., switchably coupled by switch S2/S4 as shown) to a reference voltage (e.g., electrical ground) at the other end.

In certain aspects, each of the variable capacitive elements 506a and 506b may be tuned to create a common mode resonant high impedance at two times an oscillating frequency of the resonant circuit 502a and 502b, respectively, at oscillating terminals of resonant circuit 502a and 502b, respectively, to reduce flicker noise as discussed. Further, as discussed, each of the resonant circuit 502a and 502b may have the same oscillating frequency, so the variable capacitive elements 506a and 506b may be tuned to the same capacitance.

Figure 6:
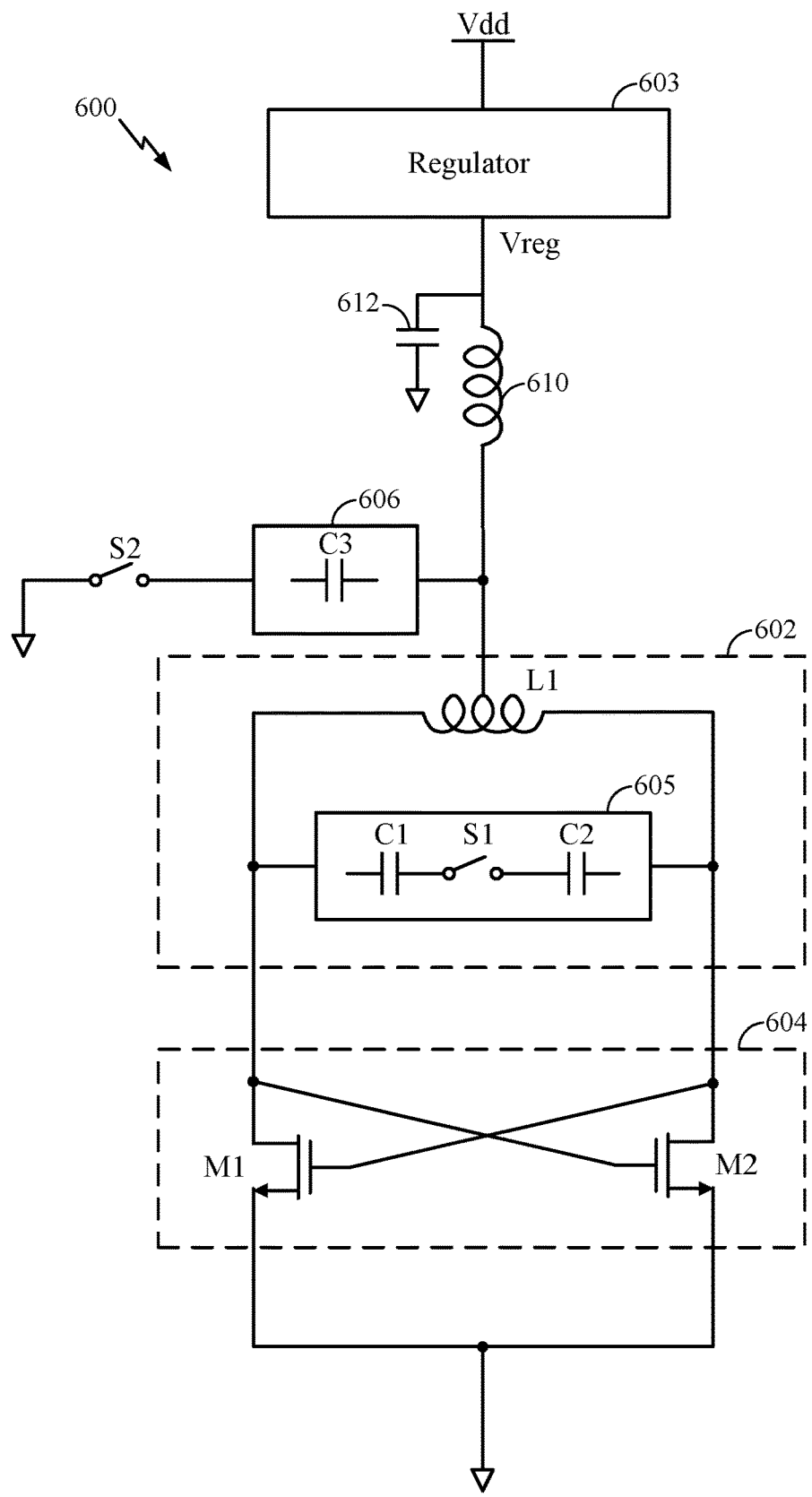
FIG. 6 is a schematic diagram of another example VCO with reduced phase noise, in accordance with certain aspects of the present disclosure.

FIG. 6 is a schematic diagram of another example VCO 600, in accordance with certain aspects of the present disclosure. As illustrated, the VCO 600 is similar to the VCO 400, but includes an inductor (e.g., choke inductor) 610 and capacitor 612 (e.g., decoupling capacitor) coupled to an output terminal of the regulator 603. The inductor 610 may be configured to provide a DC current to the resonant circuit 602. Further, the capacitor 612 may help smooth the signal from the regulator 603. In particular, the inductor 610 may be coupled between a center tap of the inductor L1 and the regulator 603. Further, the capacitor 612 may be coupled between the regulator 603 and a reference voltage (e.g., electrical ground). The inductor 610 may be configured to provide a high impedance on the path from a resonant circuit 602 to the regulator 603. In certain aspects, the inductor 610 providers a higher impedance going from the resonant circuit 602 to the regulator 603 (toward the load direction) than from the regulator 603 to the resonant circuit 602 (toward the signal source direction). Such aspects may advantageously further help reduce phase noise.

The VCO 600 includes a resonant circuit 602 (also referred to as an inductor-capacitor (LC) circuit, a tank circuit, or a tuned circuit) and an active negative transconductance ($-g_m$) circuit 604 connected with the resonant circuit 602. Certain aspects may include a bias current circuit (not shown here) for sourcing (or sinking) a bias current through the resonant circuit 602 and the active negative transconductance circuit 604 to generate an oscillating signal. As illustrated in FIG. 6, a pair of NMOS transistors M1 and M2 are cross-coupled to form the active negative transconductance circuit 604 that serves to cancel out the loss (due to parasitics) of the resonant circuit 602 and, thus, to sustain the oscillation mechanism. The resonant circuit 602 may include a center-tapped inductor L1 (or two series inductors) and a variable capacitive element 604 (e.g., shown as a capacitor bank comprising capacitors C1 and C2) designed to oscillate at a certain resonant frequency. In certain aspects, the variable capacitive element 604 may comprise a variable capacitor and/or a capacitor bank (e.g., with a plurality of capacitors switchably connected in parallel and/or series).

The inductor L1 and/or one or more capacitors in the variable capacitive element 605 may be variable to adjust the VCO 600 frequency within a tuning range. For certain aspects, the resonant circuit 602 may include one or more switches (e.g., represented by switch S1 in FIG. 6) used to select different combinations of capacitors in the variable capacitive element 605, thereby adjusting the resonance of the circuit. A regulator 603 or another circuit may provide an output voltage (Vreg) for tuning the inductor L1 and controlling the VCO frequency. For example, as shown, an output terminal of the regulator 503 is coupled to a center tap of the inductor L1. The VCO 600 may receive power from a power supply voltage (e.g., Vdd) referenced to another voltage (e.g., electrical ground).

Similar to as described above with respect to FIG. 4, the VCO 600 may include variable capacitive element 606 (e.g., shown as a capacitor C3). In certain aspects, the variable capacitive element 606 may comprise a variable capacitor and/or a capacitor bank (e.g., with a plurality of capacitors switchably connected in parallel and/or series). The variable capacitive element 606 as shown may be coupled at one end to the center tap of the inductor L1 and coupled (e.g., switchably coupled by switch S2 as shown) to a reference voltage (e.g., electrical ground) at the other end.

In certain aspects, the variable capacitive element 606 may be tuned to create a common mode resonant high impedance at two times an oscillating frequency of the resonant circuit 602, at oscillating terminals of the resonant circuit 602 to reduce flicker noise as discussed.

Figure 7:
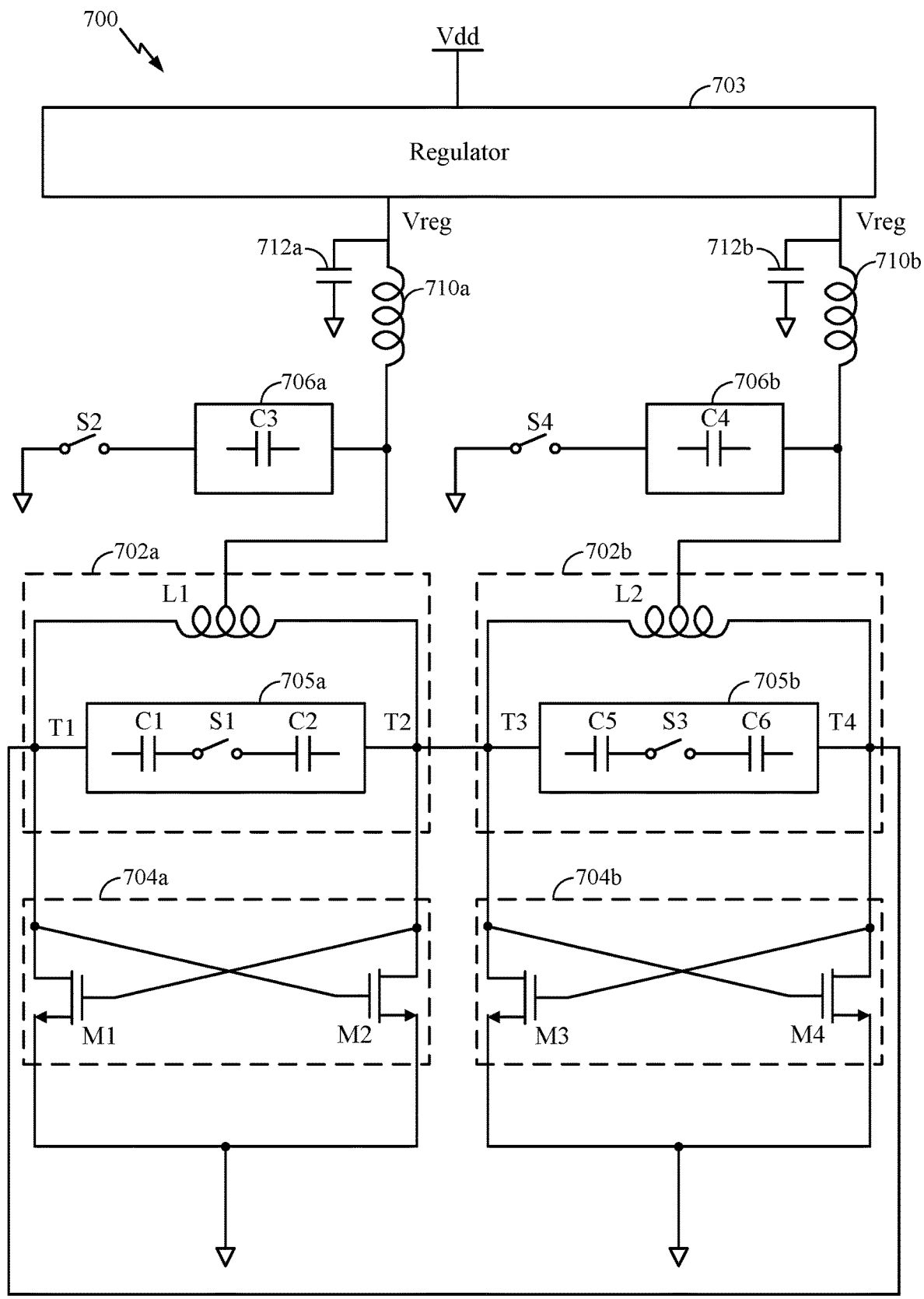
FIG. 7 is a schematic diagram of another example VCO with reduced phase noise, in accordance with certain aspects of the present disclosure.

FIG. 7 is a schematic diagram of another example VCO 700, in accordance with certain aspects of the present disclosure. As illustrated, the VCO 700 is similar to the VCO 500, but includes inductors (e.g., choke inductors) 710a/710b and capacitors 712a/712b coupled to an output terminal of the regulator 703. The inductor 710a/710b may be configured to provide a DC current to the resonant circuit 702a/702b. Further, the capacitor 712a/712b may help smooth the signal from the regulator 603. In particular, the inductor 710a/710b may be coupled between a center tap of the inductor L1/L2 and the regulator 703. Further, the capacitor 712a/712b may be coupled between the regulator 703 and a reference voltage (e.g., electrical ground).

The VCO 700 includes two resonant circuits 702a and 702b coupled to each other. In some aspects, the components of the two resonant circuits 702a and 702b may have the same properties (e.g., capacitance, impedance, inductance, etc.) and be coupled together in order to reduce a phase noise of the VCO 700 as compared to the VCO 600 (e.g., by 3 dB). In particular, the VCO 700 includes two resonant circuits 702a and 702b (also referred to as an inductor-capacitor (LC) circuit, a tank circuit, or a tuned circuit) and two active negative transconductance ($-g_m$) circuits 704a and 704b connected with the resonant circuits 702a and 702b, respectively. Certain aspects may include a bias current circuit (not shown here) for sourcing (or sinking) a bias current through the resonant circuits 702a and 702b and the active negative transconductance circuits 704a and 704b to generate an oscillating signal. As illustrated in FIG. 7, a pair of NMOS transistors M1 and M2 are cross-coupled to form the active negative transconductance circuit 704a (and similarly a pair of NMOS transistors M3 and M4 form the active negative transconductance circuit 704b) that serves to cancel out the loss (due to parasitics) of the resonant circuit 702a (and similarly resonant circuit 702b) and, thus, to sustain the oscillation mechanism. The resonant circuit 702a may include a center-tapped inductor L1 (or two series inductors) and a variable capacitive element 704a (e.g., shown as a capacitor bank comprising capacitors C1 and C2) designed to oscillate at a certain resonant frequency. In certain aspects, the variable capacitive element 704a may comprise a variable capacitor and/or a capacitor bank (e.g., with a plurality of capacitors switchably connected in parallel or series. Similarly, the resonant circuit 702b may include a center-tapped inductor L2 (or two series inductors) and a variable capacitive element 704b (e.g., shown as a capacitor bank comprising capacitors C7 and C6) designed to oscillate at a certain resonant frequency. In certain aspects, the resonant circuit 702b may be configured to oscillate at the same resonant frequency as the resonant circuit 702a to reduce phase noise. In certain aspects, the variable capacitive element 704b may comprise a variable capacitor and/or a capacitor bank (e.g., with a plurality of capacitors switchably connected in parallel or series. The resonant circuits 702a and 702b may be coupled in parallel as shown, with a terminal T1 of the resonant circuit 702a being coupled to a terminal T4 of the resonant circuit 702b, and a terminal T2 of the resonant circuit 702a being coupled to a terminal T3 of the resonant circuit 702b.

The inductor L1/L2 and/or one or more capacitors in the variable capacitive element 705a/705b may be variable to adjust the VCO 700 frequency within a tuning range. For certain aspects, the resonant circuit 702a/702b may include one or more switches (e.g., represented by switch S1/S3 in FIG. 7) used to select different combinations of capacitors in the variable capacitive element 705a/705b, thereby adjusting the resonance of the circuit. A regulator 703 or another circuit may provide an output voltage (Vreg) for tuning the inductor L1/L2 and controlling the VCO frequency. For example, as shown, an output terminal of the regulator 703 is coupled to a center tap of the inductor L1/L2. The VCO 700 may receive power from a power supply voltage (e.g., Vdd) referenced to another voltage (e.g., electrical ground).

Similar to as described above with respect to FIG. 6, the VCO 700 may include variable capacitive element 706a/706b (e.g., shown as a capacitor C3/C4). In certain aspects, the variable capacitive element 706a/706b may comprise a variable capacitor and/or a capacitor bank (e.g., with a plurality of capacitors switchably connected in parallel and/or series). The variable capacitive element 706a/706b as shown may be coupled at one end to the center tap of the inductor L1/L2 and coupled (e.g., switchably coupled by switch S2/S4 as shown) to a reference voltage (e.g., electrical ground) at the other end.

In certain aspects, each of the variable capacitive elements 706a and 706b may be tuned to create a common mode resonant high impedance at two times an oscillating frequency of the resonant circuit 702a and 702b, respectively, at oscillating terminals of resonant circuit 702a and 702b, respectively, to reduce flicker noise as discussed. Further, as discussed, each of the resonant circuit 702a and 702b may have the same oscillating frequency, so the variable capacitive elements 706a and 706b may be tuned to the same capacitance.

Figure 8:
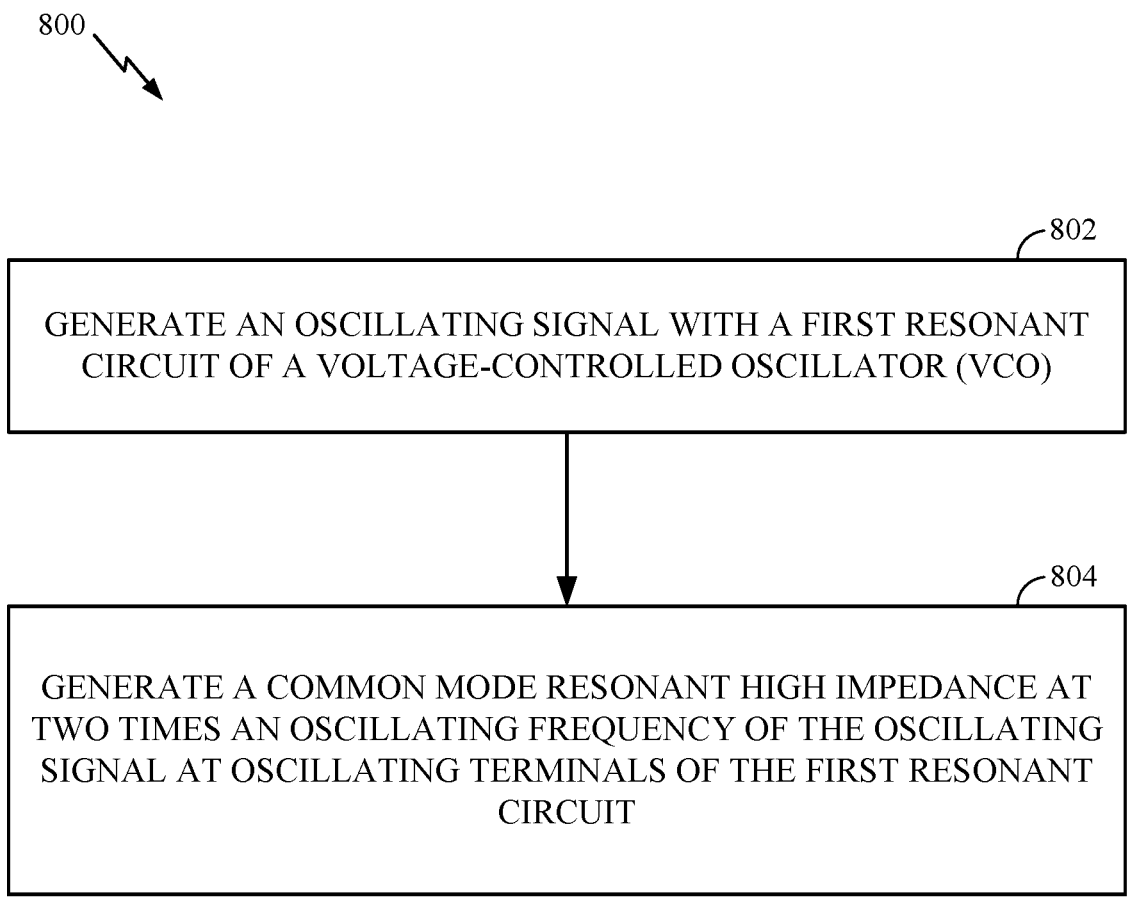
FIG. 8 is a flow diagram of example operations for reducing noise in an oscillating signal, in accordance with certain aspects of the present disclosure.

FIG. 8 is a flow diagram of example operations 800 for reducing noise in an oscillating signal, in accordance with certain aspects of the present disclosure. The operations 800 may be performed by an apparatus (e.g., a frequency synthesizer, a TX path 302, and/or an RX path 304) comprising a VCO (e.g., VCO 400-700).

The operations 800 may begin, at block 802, with the apparatus generating the oscillating signal with a first resonant circuit (e.g., resonant circuit 402) of a VCO. The first resonant circuit may be configured to control a frequency of the oscillating signal. At block 804, the apparatus may generate a common mode resonant high impedance at two times the frequency of the oscillating signal at oscillating terminals of the first resonant circuit.

According to certain aspects, the operations 800 further involve tuning a variable capacitance coupled to the voltage source based on an equivalent inductance of the first resonant circuit.

According to certain aspects, the operations 800 further entail adjusting the high impedance resonance to follow adjustments of the frequency of the oscillating signal.

Figure 9:
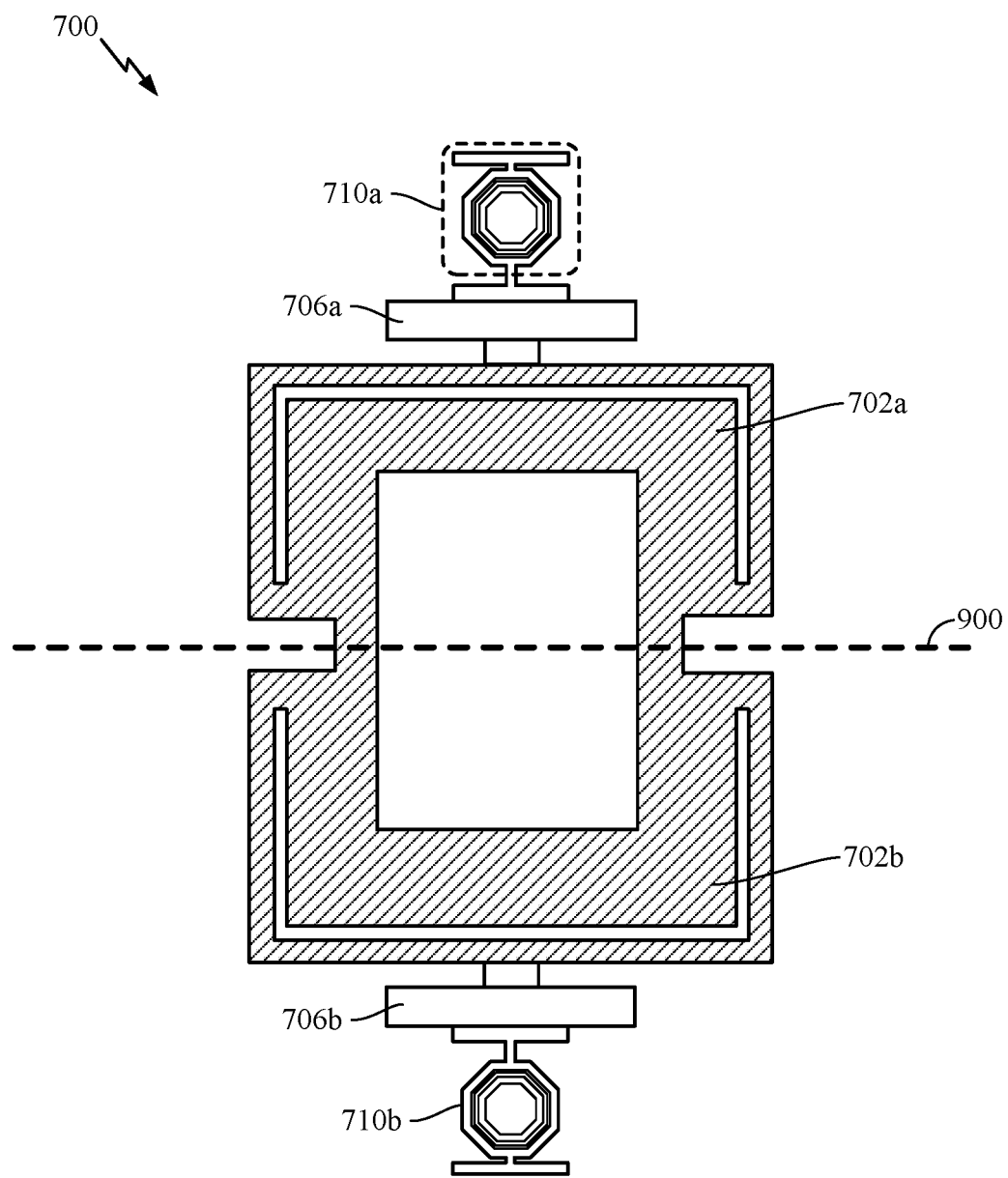
FIG. 9 is a circuit layout of an example VCO, in accordance with certain aspects of the present disclosure.

FIG. 9 is a circuit layout of an example VCO 700, in accordance with certain aspects of the present disclosure. As shown, the VCO 700 is symmetrically laid out across line 900, with resonant circuit 702a and resonant circuit 702b being coupled across the line 900. As shown, each of the inductors in the resonant circuit 702a/702b includes a thick inductor trace comprising a first turn of the inductor, and a thin inductor trace comprising a second turn on the outside of the first turn. The thick inner inductor trace, in certain aspects, may provide differential inductance, while the thin outer inductor trace may provide common-mode inductance. Further, in some aspects, the common-mode inductance provided by the thin outer inductor trace may be set/controlled by controlling the thickness of the outer inductor trace.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224*a* through 224*ap* of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for generating an oscillating signal may comprise a voltage-controlled oscillator (VCO) (e.g., the VCO 400, 500, 600, or 700 illustrated in FIG. 4, 5, 6, or 7) and a resonant circuit therein (e.g., resonant circuit 402 depicted in FIG. 4). Means for generating a high impedance resonance or tuning a variable capacitance may comprise a variable capacitive element (e.g., variable capacitive element 406 as illustrated in FIG. 4).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A voltage-controlled oscillator (VCO), comprising:
   a first resonant circuit comprising:
      a first inductor and a first variable capacitive element coupled in parallel with the first inductor via a first terminal and a second terminal; and
      a second variable capacitive element directly coupled to a center tap of the first inductor and further coupled to a reference voltage by a first switch, wherein the center tap of the first inductor is further coupled to a voltage source; and
   a second resonant circuit coupled to the first resonant circuit, the second resonant circuit comprising:
      a second inductor and a third variable capacitive element coupled in parallel with the second inductor via a third terminal and a fourth terminal;
      a fourth variable capacitive element directly coupled to a center tap of the second inductor and further coupled to the reference voltage by a second switch, wherein the center tap of the second inductor is further coupled to the voltage source;
   wherein the first terminal is coupled to the fourth terminal; and
   wherein the second terminal is coupled to the third terminal.

2. The VCO of claim 1, wherein the second variable capacitive element is tuned based on an equivalent inductance of the first resonant circuit.

3. The VCO of claim 1, wherein the second variable capacitive element is tuned to create a common mode resonant high impedance at two times an oscillation frequency of the first resonant circuit at oscillating terminals of the first resonant circuit.

4. The VCO of claim 1, wherein the second variable capacitive element is tuned based on a tuning of the first variable capacitive element.

5. The VCO of claim 1, further comprising a first active negative transconductance circuit coupled between the first resonant circuit and the reference voltage, and a second active negative transconductance circuit coupled between the second resonant circuit and the reference voltage.

6. The VCO of claim 5, wherein:
the first active negative transconductance circuit comprises a first set of cross-coupled transistors,
the second active negative transconductance circuit comprises a second set of cross-coupled transistors,
the first resonant circuit is connected with one or more sources of the first set of cross-coupled transistors, and
the second resonant circuit is connected with one or more sources of the second set of cross-coupled transistors.

7. The VCO of claim 1, further comprising:
a choke inductor coupled between the voltage source and the center tap of the first inductor; and
a capacitor coupled between the reference voltage and a node between the choke inductor and the voltage source.

8. The VCO of claim 1, further comprising another inductor coupled between the voltage source and the center tap of the first inductor, wherein the other inductor is configured to provide a first impedance toward the first resonant circuit and a second impedance toward the voltage source, wherein the second impedance is greater than the first impedance.

9. A method for reducing noise in an oscillating signal, comprising:
generating the oscillating signal with a first resonant circuit of a voltage-controlled oscillator (VCO) coupled to a second resonant circuit of the VCO;
generating a common mode resonant high impedance at two times an oscillating frequency of the oscillating signal at oscillating terminals of the first resonant circuit;
wherein the first resonant circuit comprises:
a first inductor and a first variable capacitive element coupled in parallel with the first inductor via a first terminal and a second terminal; and
a second variable capacitive element directly coupled to a center tap of the first inductor and further coupled to a reference voltage by a first switch, wherein the center tap of the first inductor is further coupled to a voltage source;
wherein the second resonant circuit comprises:
a second inductor and a third variable capacitive element coupled in parallel with the second inductor via a third terminal and a fourth terminal; and
a fourth variable capacitive element directly coupled to a center tap of the second inductor and further coupled to the reference voltage by a second switch, wherein the center tap of the second inductor is further coupled to the voltage source;
wherein the first terminal is coupled to the fourth terminal; and
wherein the second terminal is coupled to the third terminal.

10. The method of claim 9, wherein generating the common mode resonant high impedance comprises tuning a variable capacitance coupled to a voltage supply node of the first resonant circuit.

11. The method of claim 9, wherein generating the common mode resonant high impedance comprises tuning a variable capacitance coupled to a voltage supply node of the first resonant circuit based on an equivalent inductance of the first resonant circuit.

12. The method of claim 9, further comprising adjusting the common mode resonant high impedance to follow adjustments of the frequency of the oscillating signal.

13. The method of claim 9, further comprising generating a first impedance toward the first resonant circuit; and generating a second impedance toward a voltage supply node of the first resonant circuit, wherein the second impedance is greater than the first impedance.

14. An apparatus for reducing noise in an oscillating signal, comprising:
means for generating the oscillating signal comprising a first resonant circuit coupled to a second resonant circuit; and
means for generating a common mode resonant high impedance resonance at two times an oscillating frequency of the oscillating signal at oscillating terminals of the first resonant circuit;
wherein the first resonant circuit comprises:
a first inductor and a first variable capacitive element coupled in parallel with the first inductor via a first terminal and a second terminal; and
a second variable capacitive element directly coupled to a center tap of the first inductor and further coupled to a reference voltage by a first switch, wherein the center tap of the first inductor is further coupled to a voltage source;
wherein the second resonant circuit comprises:
a second inductor and a third variable capacitive element coupled in parallel with the second inductor via a third terminal and a fourth terminal; and
a fourth variable capacitive element directly coupled to a center tap of the second inductor and further coupled to the reference voltage by a second switch, wherein the center tap of the second inductor is further coupled to the voltage source;
wherein the first terminal is coupled to the fourth terminal; and
wherein the second terminal is coupled to the third terminal.

15. The apparatus of claim 14, wherein the means for generating the common mode resonant high impedance comprises means for tuning a variable capacitance coupled to a voltage supply node of the first resonant circuit.

16. The apparatus of claim 14, wherein the means for generating the common mode resonant high impedance comprises means for tuning a variable capacitance coupled to a voltage supply node of the first resonant circuit based on an equivalent inductance of the first resonant circuit.

17. The apparatus of claim 14, further comprising means for adjusting the common mode resonant high impedance to follow adjustments of the oscillating frequency of the oscillating signal.

18. The apparatus of claim 14, further comprising means for generating a first impedance toward the first resonant circuit and a second impedance toward a voltage supply node of the first resonant circuit, wherein the second impedance is greater than the first impedance.

19. A non-transitory computer readable medium having instructions stored thereon for causing a circuit to perform a method of for reducing noise in an oscillating signal, the method comprising:

controlling generation of the oscillating signal by a first resonant circuit of a voltage-controlled oscillator (VCO) coupled to a second resonant circuit of the VCO; and controlling generation of a common mode resonant high impedance at two times an oscillating frequency of the oscillating signal at oscillating terminals of the first resonant circuit;

wherein the first resonant circuit comprises:
- a first inductor and a first variable capacitive element coupled in parallel with the first inductor via a first terminal and a second terminal; and
- a second variable capacitive element directly coupled to a center tap of the first inductor and further coupled to a reference voltage by a first switch, wherein the center tap of the first inductor is further coupled to a voltage source;

wherein the second resonant circuit comprises:
- a second inductor and a third variable capacitive element coupled in parallel with the second inductor via a third terminal and a fourth terminal; and
- a fourth variable capacitive element directly coupled to a center tap of the second inductor and further coupled to the reference voltage by a second switch, wherein the center tap of the second inductor is further coupled to the voltage source;

wherein the first terminal is coupled to the fourth terminal; and wherein the second terminal is coupled to the third terminal.

20. The non-transitory computer readable medium of claim 19, wherein controlling generation of the common mode resonant high impedance comprises tuning the second variable capacitive element and the fourth variable capacitive element, wherein the second variable capacitive element is coupled to a first voltage supply node of the first resonant circuit, and wherein the fourth variable capacitive element is coupled to a second voltage supply node of the first resonant circuit.

21. The non-transitory computer readable medium of claim 19, wherein controlling generation of the common mode resonant high impedance comprises:
- tuning the second variable capacitive element of the first resonant circuit based on an equivalent inductance of the first resonant circuit, wherein the second variable capacitive element is coupled to a first voltage supply node of the first resonant circuit; and
- tuning the fourth variable capacitive element of the second resonant circuit based on an equivalent inductance of the second resonant circuit, wherein the fourth variable capacitive element is coupled to a second voltage supply node of the first resonant circuit.

22. The non-transitory computer readable medium of claim 19, wherein the method further comprises adjusting the common mode resonant high impedance to follow adjustments of the frequency of the oscillating signal.

* * * * *